United States Patent [19]

Ishikawa et al.

[11] Patent Number: 5,085,364
[45] Date of Patent: Feb. 4, 1992

[54] PRESSURE-SENSITIVE ADHESIVE FOR TEMPORARILY SECURING ELECTRONIC DEVICES

[75] Inventors: Mitsuo Ishikawa; Shigeaki Watarai, both of Tokyo, Japan

[73] Assignees: Senju Metal Industry Co., Ltd.; Nihon Junyaku Co., Ltd., both of Tokyo, Japan

[21] Appl. No.: 577,716

[22] Filed: Sep. 5, 1990

[30] Foreign Application Priority Data

Sep. 5, 1989 [JP] Japan .................................. 1-228423
Nov. 15, 1989 [JP] Japan .................................. 1-296680

[51] Int. Cl.$^5$ ...................... H05K 3/34; H01L 21/58; B23K 1/00
[52] U.S. Cl. ................................ 228/139; 228/180.2; 228/176; 156/281
[58] Field of Search ...................... 228/139, 179, 180.1, 228/180.2, 56.3, 123, 176, 213; 156/281

[56] References Cited

U.S. PATENT DOCUMENTS

| | | | |
|---|---|---|---|
| 4,749,120 | 6/1988 | Hatada | 228/123 |
| 4,851,966 | 7/1989 | Roback et al. | 228/56.3 |
| 4,979,663 | 12/1990 | Sofia et al. | 228/180.2 |
| 5,012,969 | 5/1991 | Hatada et al. | 228/180.2 |

Primary Examiner—Samuel M. Heinrich
Attorney, Agent, or Firm—Sughrue, Mion, Zinn, Macpeak & Seas

[57] ABSTRACT

A pressure-sensitive adhesive for use in temporarily securing electronic devices, particularly surface-mounting devices onto a printed circuit board in position during soldering, thereby preventing the devices from dropping from the board. The pressure-sensitive adhesive consists essentially of a resinous material having a dynamic modulus of elasticity in the range of from $10^4$ to $10^9$ dyne/cm$^2$ as measured at the soldering temperature of the electronic devices with a frequency of applied vibrations of 10 Hz. Preferably, the resinous material has a dynamic modulus of elasticity in the range of from $10^4$ to $10^7$ dyne/cm$^2$ and a value for tan $\delta$ of greater than 0.2 as measured under the above conditions. In this case, the pressure-sensitive adhesive exhibits a self-aligning effect whereby electronic devices mounted out of position on the board are forced to move toward the proper positions by the action of the surface tension of a molten solder.

13 Claims, 1 Drawing Sheet

PRESSURE-SENSITIVE ADHESIVE FOR TEMPORARILY SECURING ELECTRONIC DEVICES

BACKGROUND OF THE INVENTION

1. Field of the Invention

The present invention relates to a method for temporarily securing electronic devices on a printed circuit board during soldering. More particularly, it relates to a method for temporarily securing surface-mounting electronic devices onto a printed circuit board during soldering with a pressure-sensitive adhesive.

2. Description of the Prior Art

Recently, as electronic instruments have become compact, electronic devices used therein also have had to become more compact. As a consequence, surface mounting of electronic devices by directly securing electronic devices on the surface of a printed circuit board by means of soldering has been widely employed. Electronic devices adapted for surface mounting are called surface-mounting devices (hereinafter abbreviated as SMD's) and include flat-pack IC's and LSI's, as well as chip parts such as chip capacitors.

There are two methods for soldering SMD's to a printed circuit board: the reflow method and the dip method.

In the reflow method, a paste or cream solder (hereinafter referred to collectively as paste solder) is applied by printing to the areas to be soldered on the surface of a printed circuit board. Surface-mounting electronic devices (SMD's) are then positioned on the board and the board is heated in a reflow furnace to melt the paste solder and perform soldering of the ( SMD's to the board. Before the SMD's are mounted on the board, if necessary, an adhesive may be applied to the areas on the surface of the board on which SMD's are to be mounted in order to prevent the SMD's from dropping from the board during heating in the reflow furnace.

In the dip method, an adhesive is applied to the areas on the surface of a printed circuit board on which SMD's are to be mounted, and SMD's are mounted on the board through the adhesive and temporarily secured in position by the adhesive. The board is then processed to solder the SMD's to the board, e.g., using an automatic soldering machine which comprises a fluxer for applying a flux to the surface of the board, a preheater for preheating the board, a molten solder bath in which the board is dipped to deposit the molten solder around the terminals of the SMD's and the board, and a cooling unit for solidifying the molten solder deposited on the board.

Thermosetting adhesives and UV-curing adhesives have been used in the prior art to temporarily secure SMD's during soldering. The nature of adhesion with these adhesives is temporary before they are cured. However, the adhesive applied to the board is cured prior to or during soldering by heating in a suitable heater or in a molten solder bath or by irradiation with UV rays, thereby firmly fixing SMD's on the board in an undetachable manner, and soldering is performed under such conditions. Thus, SMD's are not temporarily secured on the printed circuit board during soldering, but are firmly fixed thereon.

Japanese Utility Model Publication No. 56-11438(1981) discloses a row of SMD's which comprises a plurality of SMD's detachably secured in a row on a tape by means of an adhesive comprising at least a thermosetting adhesive. The SMD's can be detached from the tape along with the adhesive and mounted onto a printed circuit board by the adhesive before soldering. The SMD's are firmly fixed on the board during soldering since the thermosetting adhesive is cured by heating prior to or during soldering.

Japanese Patent Application Kokai No. 64-69092(1989) describes a surface mounting device (SMD) which has an adherent or tacky thin layer on the seating plane thereof and which can be temporarily secured to a printed circuit board. The thin layer specifically disclosed in the example of that Japanese application is a thin layer which is impregnated with a thermosetting adhesive. Therefore, after the SMD's are mounted on a printed circuit board, they can be detached from the board while the adhesive is kept uncured before heating. However, they are heated immediately after mounting in order to thermoset the adhesive so that they are firmly fixed to the board during soldering. Thus, the nature of adhesion cannot be said to be temporary in a strict sense.

The above Japanese application discloses that the thin layer may be impregnated with a pressure-sensitive adhesive to impart tackiness to the layer. However, there is no specific disclosure concerning the pressure-sensitive adhesive. Most conventional pressure-sensitive adhesives are not considered to be effective at high temperatures above 200° C. at which soldering is performed, and therefore it has not been attempted to use a pressure-sensitive adhesive to temporarily secure SMD's on a board during soldering.

The use of adhesives, and particularly UV-curable adhesives is costly since these adhesives themselves are expensive and a special, complicated UV irradiation apparatus is required to cure the adhesives. After a UV-curable adhesive is applied to a printed circuit board, the board must be passed through the UV irradiation apparatus, which is troublesome.

When a thermosetting or UV-curing adhesive is used to secure SMD's onto a printed circuit board, SMD's are firmly secured to the board before or during soldering. In one sense, this is advantageous in that SMD's are rarely detached from the board even if a considerable force is applied thereto. However, when SMD's are mounted out of position onto the board, the adhesive firmly holds the mispositioned SMD's on the board, so solder is sometimes deposited in an undesirable manner. For example, the solder is deposited such that it does not connect one or more sets of terminals on the SMD's and on the board which should be connected by the solder, so that a proper circuit is not formed. Furthermore, solder may be deposited so as to connect an undesirable combination of terminals on the SMD's and on the board resulting in a short circuit.

Under the existing circumstances in which simplification of production lines for electronic instruments is required in order to decrease product costs, the use of a thermosetting or UV-curable adhesive to secure SMD's during soldering is not sufficient.

SUMMARY OF THE INVENTION

An object of the present invention is to provide a method for temporarily securing SMD's onto a printed circuit board during soldering which makes it possible to simplify soldering lines, thereby decreasing the production costs of electronic instruments.

Another object of the invention is to provide a method for temporarily securing SMD's onto a printed circuit board during soldering which eliminates the above-mentioned problems involved in the use of a thermosetting or UV-curable adhesive.

It has been found that a pressure-sensitive adhesive can effectively function at high temperatures and successfully secure and hold SMD's on a printed circuit board during soldering when the resinous material of which the pressure-sensitive adhesive essentially consists has a dynamic modulus of elasticity in a certain range at the soldering temperature.

The present invention provides a method for temporarily securing electronic devices onto a printed circuit board during soldering, comprising, using a pressure-sensitive adhesive which consists essentially of a resinous material having a dynamic modulus of elasticity in the range of from $10^4$ to $10^9$ dyne/cm$^2$ as measured at the soldering temperature with a frequency of applied vibrations of 10 Hz.

DETAILED DESCRIPTION OF THE INVENTION

Figure 1:
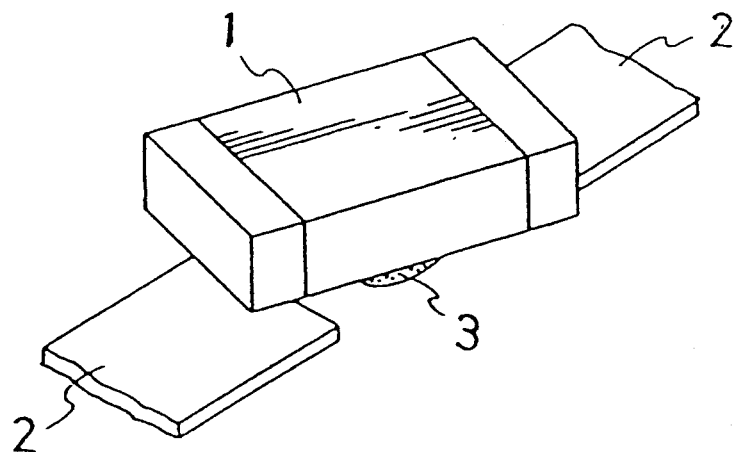
FIG. 1 is a schematic perspective view showing a chip capacitor before soldering which is mounted out of position on a printed circuit board.

The pressure-sensitive adhesive used in the present invention to temporarily secure SMD's during soldering consists essentially of a resinous material having a dynamic modulus of elasticity in the range of from $10^4$ to $10^9$ dyne/cm$^2$ as measured at the soldering temperature with a frequency of applied vibrations of 10 Hz.

When the dynamic modulus of the resinous material is less than $10^4$ dyne/cm$^2$, the fluidity of the pressure-sensitive adhesive will be too high to firmly hold SMD's in proper positions to be mounted on the board. On the other hand, when the dynamic modulus of the material is greater than $10^9$ dyne/cm$^2$, the adhesiveness of the pressure-sensitive adhesive is increased but its tackiness is decreased. Therefore, it becomes difficult to deal with the pressure-sensitive adhesive.

Polymeric resinous materials are generally viscoelastic bodies which exhibit both elasticity and viscosity properties. The elasticity of a viscoelastic body can be characterized by a complex modulus of elasticity $G^*$ which is measured by applying sinusoidal vibrational strains at a predetermined frequency to the body and which is expressed by the following formula:

$$G^* = G' + iG''$$

wherein $G'$ is a dynamic modulus of elasticity (also called storage modulus) and $G''$ is a loss modulus. The ratio $G''/G'$ is a loss tangent (also called tan $\delta$). All these parameters depend on the frequency of applied vibrations.

Similarly, the viscosity of a viscoelastic body can be characterized by a complex viscosity $\eta^*$ which is expressed by the following formula:

$$\eta^* = \eta' - i\eta''.$$

There exist certain correlations between $G^*$ and $\eta^*$, $G'$ and $\eta'$, and $G''$ and $\eta''$.

It has been found that among the above parameters characterizing the viscoelasticty of a resinous material, the dynamic modulus $G'$ measured at the soldering temperature contributes most greatly to the function of the resinous material as a pressure-sensitive adhesive at the soldering temperature and can be used as an indication to evaluate the effectiveness of a resinous material as a pressure-sensitive adhesive at that temperature.

As mentioned above, the dynamic modulus $G'$ of a resinous material varies depending on the frequency of vibrations applied in a test to measure the modulus. However, as a result of experiments performed at various frequencies, a significant variation in the values of dynamic modulus $G'$ with frequency was not found as shown in the following Table 1. Therefore, the value of dynamic modulus $G'$ measured at 10 Hz is selected as an indication in the present invention.

TABLE 1

| Type of pressure-sensitive adhesive | Frequency | $G'$ (dyne/cm$^2$) | $G''$ (dyne/cm$^2$) | tan $\delta$ ($G''/G'$) |
|---|---|---|---|---|
| A (Lacquer-type) | 3 Hz | 3.1 × 10$^5$ | 2.3 × 10$^5$ | 0.73 |
|  | 10 Hz | 4.3 × 10$^5$ | 2.7 × 10$^5$ | 0.69 |
|  | 30 Hz | 7.3 × 10$^5$ | 3.8 × 10$^5$ | 0.52 |
| B (Emulsion-type) | 3 Hz | 1.0 × 10$^5$ | 3.8 × 10$^4$ | 0.37 |
|  | 10 Hz | 1.3 × 10$^5$ | 3.8 × 10$^4$ | 0.43 |
|  | 30 Hz | 1.8 × 10$^5$ | 5.8 × 10$^4$ | 0.46 |
| C (Emulsion-type) | 3 Hz | 3.9 × 10$^5$ | 3.7 × 10$^4$ | 0.09 |
|  | 10 Hz | 4.3 × 10$^5$ | 5.7 × 10$^4$ | 0.13 |
|  | 30 Hz | 4.7 × 10$^5$ | 7.7 × 10$^4$ | 0.16 |

The dynamic modulus of a resinous material can be measured on a test piece in the form of a film by using a commercially-available viscoelasticity spectrometer, e.g., VES-F3 or E-111 manufactured by Iwamoto Manufacturing in Japan.

In a preferred embodiment, the resinous material used in the present invention has a dynamic modulus in the range of from $10^4$ to $10^7$ dyne/cm$^2$ and a value for tan $\delta$ of greater than 0.2 as measured at the soldering temperature with a frequency of applied vibrations of 10 Hz. In this case, the pressure-sensitive adhesive consisting essentially of such a resinous material exhibits a self-aligning effect during soldering.

The term "self-aligning effect" used herein means that when SMD's are mounted before soldering on a printed circuit board in improper positions, as shown in FIG. 1, somewhat deviating from predetermined proper positions aligned with the corresponding terminals on the board and temporarily secured in such improper positions with a pressure-sensitive adhesive, the SMD's are forced to move toward the proper positions by being pulled by the action of surface tension of a molten solder during molding.

Figure 2:
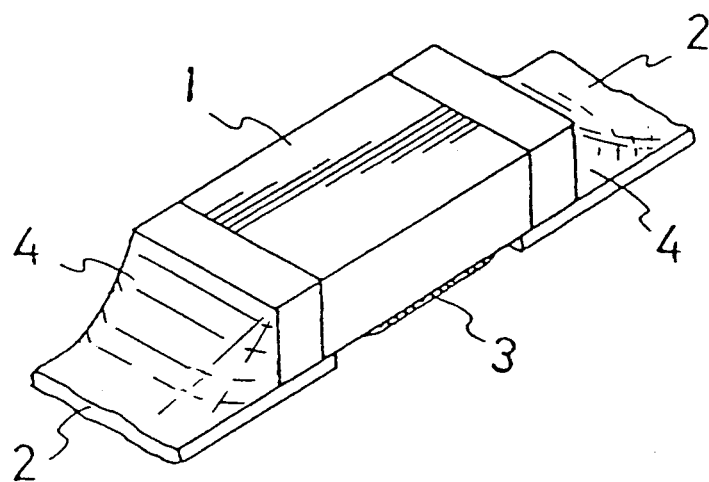
FIG. 2 is a schematic perspective view showing a chip capacitor soldered in correct position on a printed circuit board.

A molten solder deposits only around the terminals on a printed circuit board and those of SMD's since only the terminals are wettable by the molten solder and the other areas repel it. In general, a molten solder has a high density and its surface tension is strong enough to move light parts such as SMD's. Therefore, even if SMD's are mounted in improper positions and temporarily secured as such with a pressure-sensitive adhesive, the surface tension of the molten solder deposited on the proper positions overcomes the adhesion by the pressure-sensitive adhesive and moves the SMD's toward the proper positions against the adhesion by the adhesive. As a result, each SMD's is always soldered in position on a printed circuit board, i.e., extending in alignment with the corresponding opposite terminals provided on the board, as shown in FIG. 2.

When the resinous material has a dynamic modulus greater than $10^7$ dyne/cm$^2$ or a value for tan δ of smaller than 0.2, the adhesion of the pressure-sensitive adhesive increases to such a degree that it overcomes the surface tension of the molten solder and therefore the self-aligning effect is lost. However, such a resinous material has a strong adhesion and hence an increased holding power for SMD's. Therefore, in the cases where the self-aligning effect is not required, such as where SMD's are mounted by use of an automatic mounter capable of mounting SMD's accurately in predetermined positions, a resinous material having a dynamic modulus greater than $10^7$ dyne/cm$^2$ or a value for tan δ of smaller than 0.2 can be employed satisfactorily in the pressure-sensitive adhesive of the present invention as long as its dynamic modulus is in the range of $10^4$ to $10^9$ dyne/cm$^2$.

The composition of the resinous material is not critical and any resinous material having a dynamic modulus in the range of $10^4$ to $10^9$ dyne/cm$^2$ when measured at the soldering temperature, e.g., in the range of 200° to 280° C., can be used to form the pressure-sensitive adhesive used in the present invention. Examples of resinous materials having such a dynamic modulus are resin compositions which comprise one or more resin components exhibiting sufficient adhesion at room temperature (hereinafter referred to as adhesion-imparting components), and optionally one or more resin components having excellent heat resistance (hereinafter referred to as heat-resisting components) which are blended or copolymerized with the adhesion-imparting components.

Resins which are useful as the adhesion-imparting components include the following:

acrylate copolymers such as copolymers of an acrylate ester, a methacrylate ester, acrylonitrile, acrylic acid, and methacrylic acid;

silicone rubbers such as polydimethylsiloxane and vinylsilicone rubber;

silicone-acrylate copolymers prepared by copolymerizing one or more acrylic monomers such as an acrylate, a methacrylate, acrylonitrile, acrylic acid, and methacrylic acid with one or more monomers for the production of silicone rubber;

diene rubbers such as butadiene rubber, styrene-butadiene rubber, acrylonitrile-butadiene rubber, isoprene rubber, and chloroprene rubber;

vinyl ether resins such as alkylvinylether polymers, e.g., polyvinylmethylether;

vinylpyrrolidone-based resins; and polysaccharides, amylopectin, and plant gums.

Of these, silicone rubbers and silicone-acrylate copolymer resins have excellent heat resistance, so they exhibit sufficient adhesion at the soldering temperature in the absence of a heat-resisting component. Thus, they also serve as a heat-resisting component and can constitute the pressure-sensitive adhesive solely.

Other resins which are useful as a heat-resisting component include silicone resins, fluororesins, polyimide resins, aromatic polyamide resins, and urethane-acrylate copolymer resins.

An example of the resin composition suitable for use in the pressure-sensitive adhesive used in the present invention can be prepared from one or more of the following resin components:

(a) 0–100% by weight of a silicone rubber,
(b) 0–100% by weight of a silicone-acrylate copolymer,
(c) 10–80% by weight of an acrylate copolymer, and
(d) 0–20% by weight of an urethane-acrylate copolymer.

The percentage "100%" in the above composition means that the component can be used solely to form the resinous material.

The dynamic modulus of the resinous material can be adjusted by varying the proportions of the resin components. For example, with the above-mentioned resin compositions consisting of one or more components selected from (a) to (d), the dynamic modulus is decreased as the proportion of the acrylate copolymer is increased, while it is increased as the proportion of the silicone rubber, silicone-acrylate copolymer, or urethane-acrylate copolymer is increased.

Furthermore, when the dynamic modulus of the resinous material at the soldering temperature is insufficient, it can be increased by incorporation of a crosslinking agent. Examples of crosslinking agents useful for this purpose include aziridine-, epoxy-, melamine-, and isocyanate-type crosslinking agents. The amount of the crosslinking agent incorporated in the resinous material should be selected such that the resulting resinous material has a dynamic modulus at the soldering temperature in the range defined herein.

The pressure-sensitive adhesive can be used in the form of a coating composition which is either a solution of the resinous material in an organic solvent (lacquer-type composition) or a dispersion of the resinous material in an aqueous medium (emulsion-type composition). Suitable organic solvents for use in the preparation of a lacquer-type composition include alcohols, ketones, and aromatic hydrocarbons.

In addition to the resinous material and solvent, one or more additives such as a pH adjusting agent, antifoamer, preservative, flow control agent, thickening agent, or coloring agent may be added in minor amounts to the coating composition.

After the coating composition is applied, the coatings are dried, if necessary, with heating to remove the solvent or medium, leaving a layer of the pressure-sensitive adhesive which can hold SMD's successfully at the soldering temperature.

The pressure-sensitive adhesive of the present invention can be used in various ways to temporarily secure SMD's during soldering. It can be used in both the reflow method and the dip method of soldering.

For example, the areas to be mounted with SMD's on the surface of a printed circuit board are coated with a coating composition of the pressure-sensitive adhesive, e.g., by printing or dropping from a dispenser, and after drying the coating SMD's are mounted on the coating and pressed to temporarily secure SMD's to the board by means of the coated layer of the pressure-sensitive adhesive.

Less preferably, the pressure-sensitive adhesive may be applied to the back surface (seating plane) of each SMD instead of the printed circuit board and processed in the same way as above.

Furthermore, the pressure-sensitive adhesive may be applied to a support in the form of a tape or sheet having a releasing surface to form a pressure-sensitive adhesive medium for temporarily securing SMD's. The releasing surface of the support may be coated with the pressure-sensitive adhesive either continuously or discretely, i.e., in the form of patches having a size equal to or smaller than that of SMD's. When the adhesive is applied discretely to the support, it is preferable that the distances between adjacent patches of the adhesive be substantially equal, i.e., the patches be disposed in regular intervals so as to facilitate the use of an automatic machine such as an automatic mounter. After drying the coating, SMD's are placed on the adhesive coating of the support and pressed so as to be secured by the adhesive. In this case, when the SMD's are removed from the support, the pressure-sensitive adhesive is also removed from the releasing surface of the support with remaining attached to the back surface of the SMD's. Thereafter, the SMD's are mounted in position on a printed circuit board and secured on the board through the pressure-sensitive adhesive attached to their back surfaces.

Alternatively, when the pressure-sensitive adhesive is applied to the support in the form of patches, the resulting patches of the pressure-sensitive adhesive after drying may be removed from the releasing surface of the support and placed in proper positions on a printed circuit board, or they may be directly transferred from the support to the board. After the adhesive is applied to the board in this manner, SMD's are placed and temporarily secured on the board by the adhesive.

In another procedure, dry patches of the pressure-sensitive adhesive are formed on a releasing surface of a sheet-like support with a pattern or arrangement of patches corresponding to the arrangement of SMD's which are to be mounted on a printed circuit board. The patches of the adhesive in a pattern on the support are directly transferred from the support to the board by contacting the support with the board through the patches of adhesive, and SMD's are mounted on the printed circuit board through the adhesive and temporarily secured with the adhesive.

After SMD's are temporarily secured on a printed-circuit board with the pressure-sensitive adhesive, they are soldered to the printed-circuit board. During soldering, the SMD's are held in position with the adhesive and prevented from dropping from the board.

As discussed above, the pressure-sensitive adhesive used in the present invention can successfully hold SMD's in position on a printed circuit board during soldering merely by coating and drying. There is no need to cure the coating using a special curing apparatus such as a heater or a UV-irradiation apparatus. Therefore, it is simple to use and has inexpensive installation costs, thereby enabling simplification of a soldering line for SMD's.

Moreover, when the dynamic modulus and loss tangent (tan $\delta$) of the resinous material are adjusted to be within the prescribed ranges, the pressure-sensitive adhesive can exert a self-aligning effect by which SMD's are forced to move toward their proper positions by the action of surface tension of a molten solder during soldering. As a result, disconnection caused by a failure of soldering between the terminals of SMD's and the corresponding terminals of a printed circuit board and short-circuits caused by soldering an improper combination of terminals between SMD's and the board, as well as a deterioration in appearance of the board mounted with SMD's can be prevented, leading to an improvement in the quality of soldering.

The following example are given to illustrate the present invention. It should be understood, however, that the present invention is not limited to the specific details set forth in the example. All the percents in the example are by weight unless otherwise indicated.

EXAMPLE

Coating compositions of pressure-sensitive adhesives were prepared by dispersing a resinous material in water to obtain a total solids content of 40-60%. The resinous materials used in the example had different dynamic moduli and were mixtures of the following resin components in various proportions in the ranges indicated below based on the total weight of the resins:

(a) 30-60% of an acrylate copolymer resin (HVC-5200 manufactured by Toa Gosei Chemical Industry);

(b) 0-10% of an urethane-acrylate copolymer resin (UAP-070 manufactured by ARC Japan); and (c) 40-60% of a silicone-acrylate copolymer resin (TY-B manufactured by Nihon Junyaku).

For comparison, a coating composition in which the resinous material consisted solely of the above acrylate copolymer resin was also prepared in the same manner as above.

In some compositions, an isocyanate-type crosslinking agent (FS-250 manufactured by Meisei Kagaku Kogyo) was added in a proportion of 0.1-5.0% based on the total weight of the resins in order to increase the dynamic modulus of the resulting resinous material.

The dynamic moduli of the resinous materials were measured at a temperature of 260° C. at 10 Hz with a test piece which was a 0.7 mm-thick film of each resinous material prepared by coating a releasing sheet with the coating composition to be tested followed by drying. A viscoelasticity spectrometer manufactured by Iwamoto Manufacturing was used for the measurements. The dynamic moduli of the resinous materials could be increased as the proportion of the urethane-acrylate copolymer resin component or that of the crosslinking agent was increased.

Each of the pressure-sensitive adhesives was evaluated in terms of its ability to temporarily secure SMD's and the self-aligning effect during soldering by the following testing methods.

Ability to temporarily secure SMD's:

A coating composition of the pressure-sensitive adhesive to be tested was applied to the areas on a printed circuit board on which SMD's were to be mounted with a dry coating weight of 4 mg/cm$^2$. After drying of the coating, 100 chip capacitors each measuring 3.2 mm $\times$ 1.6 mm $\times$ 0.8 mm were mounted in proper positions on the board to which the pressure-sensitive adhesive had been coated. The board on which chip capacitors were temporarily secured by the adhesive was turned over and soldering was performed using an automatic soldering machine equipped with a turbulent solder bath by dipping the board in the solder bath at about 260° C. The number of chip capacitors that dropped from the board during soldering was determined. When at least one of the chip capacitors dropped from the board during soldering, the adhesive was rated as a failure. On the other hand, when all the chip capacitors remained on the board during soldering, it was rated as passing.

Self-aligning effect:

As shown in FIG. 1, a chip capacitor 1 measuring 3.2 mm×1.6 mm×0.8 mm was intentionally mounted out of position between opposite terminals 2,2 on a printed circuit board to which the chip was to be soldered, i.e., not in alignment with the terminals 2,2 on the board but turned by an angle of about 30 degrees from the aligned position, and temporarily secured in this improper position with a pressure-sensitive adhesive 3 which had been applied in a proper area of the board, i.e., between the terminals 2,2. After the board was mounted with 25 chip capacitors in this non-aligned manner, the board was turned over and soldering was performed by the dip method in the same manner as described above.

Figure 3:
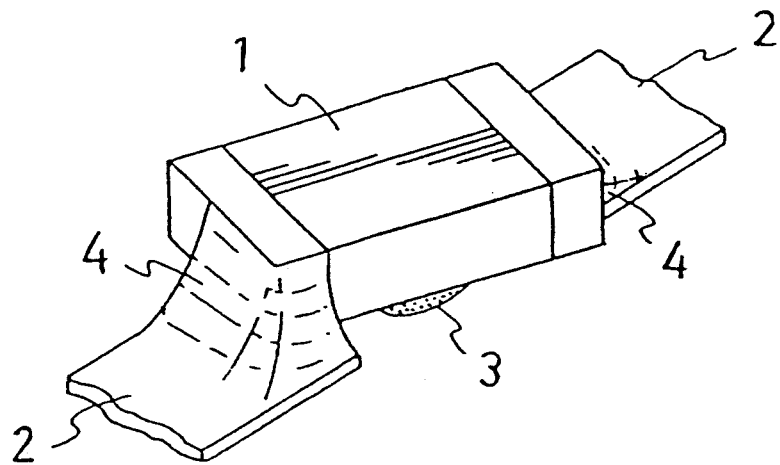
FIG. 3 is a schematic perspective view showing a chip capacitor soldered out of position.

When the pressure-sensitive adhesive has a satisfactory self-aligning effect, each chip capacitor 1 is forced to move toward the proper position in alignment with the terminals 2,2 by the action of the surface tension of a molten solder deposited around the terminals 2,2 during soldering so that the soldered chip capacitor 1 is fixed in alignment with the opposite terminals 2,2 on the board by the solder 4, as shown in FIG. 2. In contrast, when it has no self-aligning effect, the surface tension of the molten solder cannot move the chip capacitor 1 which has been mounted out of position toward the proper position in alignment with the opposite terminals 2,2 during soldering and the solder 4 is deposited around the terminals to fix the chip capacitor as it is retained in its initial improper position, as shown in FIG. 3.

The self-aligning effect was evaluated by visually observing the position of the chip capacitors after soldering. The chips were given the following ratings:

Excellent: The chips were moved such that they were nearly in alignment with the terminals;
Good: The chips were moved toward the proper positions but were not in alignment with the terminals;
Fair: The chips were slightly moved toward the proper positions;
Failure: The chips were not moved and were fixed in the initial positions.

The dynamic modulus and tan δ of each resinous material used and the test results are summarized in Table 2.

TABLE 2

| Example No. | Composition of resinous material | | | Dynamic modulus* (dyne/cm$^2$) | tan δ | Temporary securing ability | Self-aligning effect |
| --- | --- | --- | --- | --- | --- | --- | --- |
| | a | b | c | | | | |
| 1 | 60 | 0 | 40 | 10$^4$ | 0.45 | Passing | Excellent |
| 2 | 55 | 5 | 40 | 10$^5$ | 0.40 | Passing | Excellent |
| 3 | 50 | 5 | 45 | 10$^{5.5}$ | 0.30 | Passing | Excellent |
| 4 | 45 | 10 | 45 | 10$^6$ | 0.28 | Passing | Good |
| 5 | 40 | 10 | 50 | 10$^7$ | 0.25 | Passing | Fair |
| 6 | 35 | 10 | 55 | 10$^8$ | 0.20 | Passing | Failure |
| 7 | 30 | 10 | 60 | 10$^9$ | 0.15 | Passing | Failure |
| 8** | 100 | 0 | 0 | 10$^3$ | 0.50 | Failure | Excellent |

*measured at 260° C.;
**Comparative example.

As can be seen from the above results, a pressure-sensitive adhesive consisting essentially of a resinous material having a dynamic modulus in the range of 10$^4$ to 10$^9$ dyne/cm$^2$ could satisfactorily secure SMD's during soldering. Particularly, when the resinous material had a dynamic modulus in the range of 10$^4$ to 10$^7$ dyne/cm$^2$ and a value for tan δ of greater than 0.2, the pressure-sensitive adhesive exhibited a self-aligning effect.

Although the present invention has been described with respect to preferred embodiments, it is to be understood that variations and modifications may be employed without departing from the concept of the present invention as defined in the following claims.

What is claimed is:

1. In a method for soldering electronic devices on a printed circuit board, the improvement comprising temporarily securing the electronic devices on the board with a pressure-sensitive adhesive during soldering, said pressure-sensitive adhesive consisting essentially of a resinous material having a dynamic modulus of elasticity in the range of from 10$^4$ to 10$^9$ dyne/cm$^2$ as measured at the soldering temperature of the electronic devices with a frequency of applied vibrations of 10 Hz.

2. A method as defined in claim 1, wherein the resinous material comprises at least one resin component which imparts adhesion and at least one resin component which imparts heat resistance.

3. A method as defined in claim 2, wherein the resinous material comprises one or more components selected from the group consisting of:
   (a) 0–100% by weight of a silicone rubber,
   (b) 0–100% by weight of a silicone-acrylate copolymer,
   (c) 10–80% by weight of an acrylate copolymer, and
   (d) 0–20% by weight of an urethane-acrylate copolymer.

4. A method as defined in claim 2, wherein the resinous material further comprises a crosslinking agent.

5. A method as defined in claim 1, wherein the pressure-sensitive adhesive consists essentially of a resinous material having a dynamic modulus of elasticity in the range of from 10$^4$ to 10$^7$ dyne/cm$^2$ and a value for tan δ of greater than 0.2 as measured at the soldering temperature of the electronic devices with a frequency of applied vibrations of 10 Hz and exhibiting a self-aligning effect.

6. A method as defined in claim 5, wherein the resinous material comprises at least one resin component which imparts adhesion and at least one resin component which imparts heat resistance.

7. A method as defined in claim 6, wherein the resinous material comprises one or more components selected from the group consisting of:
   (a) 0–100% by weight of a silicone rubber,
   (b) 0–100% by weight of a silicone-acrylate copolymer,
   (c) 10–80% by weight of an acrylate copolymer, and
   (d) 0–20% by weight of an urethane-acrylate copolymer.

8. A method as defined in claim 6, wherein the resinous material further comprises a crosslinking agent.

9. A method as defined in claim 1, wherein the pressure-sensitive adhesive is applied to those areas of the printed circuit board on which the electronic devices are to be mounted and the electronic devices are mounted on the board through the adhesive and temporarily secured with the adhesive during soldering.

10. A method as defined in claim 1, wherein the pressure-sensitive adhesive is applied to the seating plane of each of the electronic devices and the electronic devices are mounted on the printed circuit board through the adhesive and temporarily secured with the adhesive during soldering.

11. A method as defined in claim 1, wherein the pressure-sensitive adhesive is applied to a releasing surface of a support, the seating planes of the electronic devices are contacted with the adhesive applied to the support, the electronic devices are removed from the support while the adhesive remains attached to the seating planes of the devices, and the electronic devices are mounted on the printed circuit board through the adhesive and temporarily secured with the adhesive during soldering.

12. A method as defined in claim 1, wherein the pressure-sensitive adhesive is applied discretely in the form of patches to a releasing surface of a support, the patches of the pressure-sensitive adhesive is transferred to those areas of the printed circuit board on which the electronic devices are to be mounted, and the electronic devices are mounted on the board through the adhesive and temporarily secured with the adhesive during soldering.

13. A method as defined in claim 12, wherein the support is in sheet form, the pressure-sensitive adhesive is applied discretely to the releasing surface of the support with a pattern of patches corresponding to that of the electronic devices which are mounted on the printed circuit board, the patches of the adhesive are directly transferred from the support to the board.

* * * * *